(12) United States Patent
Tsuji et al.

(10) Patent No.: US 6,903,577 B2
(45) Date of Patent: Jun. 7, 2005

(54) DELAY CIRCUIT

(75) Inventors: Nobuaki Tsuji, Hamamatsu (JP);
Masao Noro, Hamamatsu (JP);
Kunihiko Mitsuoka, Iwata (JP);
Yasuhiko Sekimoto, Hamakita (JP);
Masamitsu Hirano, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 153 days.

(21) Appl. No.: 10/439,492

(22) Filed: May 16, 2003

(65) Prior Publication Data

US 2004/0032704 A1 Feb. 19, 2004

(30) Foreign Application Priority Data

May 17, 2002 (JP) ....................................... 2002-143571

(51) Int. Cl.[7] ......................................... H03K 19/0175
(52) U.S. Cl. .......................................... 326/82; 326/93
(58) Field of Search ............................ 326/82, 83, 86, 326/93

(56) References Cited

U.S. PATENT DOCUMENTS

| | | | | |
|---|---|---|---|---|
| 5,095,233 A | * | 3/1992 | Ashby et al. ................ 327/149 |
| 5,233,617 A | * | 8/1993 | Simmons et al. ............ 714/814 |
| 5,748,616 A | * | 5/1998 | Riley ........................... 370/242 |
| 6,747,500 B2 | * | 6/2004 | Mawet ......................... 327/278 |
| 6,765,423 B2 | * | 7/2004 | Higuchi ....................... 327/270 |
| 6,836,127 B2 | * | 12/2004 | Marshall et al. ............. 324/606 |
| 6,842,044 B1 | * | 1/2005 | Feng et al. ................... 326/82 |

* cited by examiner

*Primary Examiner*—Don Le
(74) *Attorney, Agent, or Firm*—Pillsbury Winthrop Shaw Pittman LLP

(57) ABSTRACT

An input signal (SIN) is inverted by an inverter (101), and the inverted input signal is entered into a tri-state type inverter (104). An output portion of this inverter is connected via a delay path (105) to an input portion of an operational amplifier (106). This operational amplifier owns a hysteresis characteristic with respect to a signal entered thereinto. An exclusive-OR gate circuit (103) controls to set the output state of the inverter to a low impedance state upon receipt of a signal (S11) obtained by inverting the input signal, and controls to set the output state of the inverter to a high impedance state upon receipt of a signal (S16) output from the operational amplifier. As a result, an amplitude of a signal (S15) is limited to a constant amplitude in response to the hysteresis characteristic of the operational amplifier (106), and a delay time is made constant.

13 Claims, 9 Drawing Sheets

DELAY CIRCUIT

BACKGROUND OF THE INVENTION

The present invention is related to a delay circuit for delaying a signal by a constant time. More specifically, the present invention is directed to a circuit technique capable of obtaining a delay time in correspondence with a time constant which is determined based upon both a resistive element and a capacitance element.

FIG. 8 indicates an example of an arrangement of a related delay circuit. In this drawing, an input signal SIN is applied to an input portion of an inverter 301, and an input portion of another inverter 302 is connected to an output portion of this inverter 301. An output portion of the inverter 302 is connected to an inverting input terminal (−) of an operational amplifier 304 via a delay path 303 which is constructed of a resistive element 303A and a capacitive element 303B. A resistive element 304A for feedback purpose is connected between an output portion of the operational amplifier 304 and a non-inverting input terminal (+) thereof, and also, this non-inverting input terminal (+) is biased to a reference voltage "VREF" via a resistive element 304B. These operational amplifier 304 and resistive elements 304A, 304B may function as a comparator having a hysteresis characteristic with respect to a signal which is inputted to the non-inverting input terminal (−) of the operational amplifier 304. In other words, this comparator represents a high input logic threshold value "VTH" with respect to such an input signal whose signal level is transited to a high level, whereas this comparator represents a low input logic threshold value "VTL" with respect to such an input signal whose signal level is transited to a low level.

Next, operations of the above-described related delay circuit will now be explained with reference to a waveform diagram shown in FIG. 9.

First, under initial condition, the signal level of the input signal SIN is a low level, and a signal level of a signal S31 output from the inverter 301 into which this signal SIN is inputted is a high level. As a consequence, a signal level of a signal S33 appearing on the delay path 303 which is driven by the inverter 302 is a low level, whereas a signal level of a signal S34 output from the operational amplifier 304 into which this signal S33 having the low level is inputted is a high level. When the input signal SIN having; the low level is transited to a high level from this condition, the signal level of the signal S31 is transited to a low level, and also, the signal level of the signal S32 is transited to a high level. As a result, the signal S33 starts to ascend at a rate corresponding to the time constant which is determined based upon both the resistive element 303A and the capacitive element 303B. Then, when the signal S33 exceeds the high input logic threshold value VTH of the comparator constituted by the operational amplifier 304, the signal level of the signal S34 output from this operational amplifier 304 is transited to a low level.

Subsequently, when the signal level of the input signal SIN is transited to a low level, the low level of the signal S31 is transited to a high level, and the signal-level of the signal S32 is transited to a low level. When the signal level of this signal S32 is transited to the low level, the signal S33 starts to descend at the rate corresponding to the time constant which is determined based upon both the resistive element 303A and the capacitive element 303B. Then, when the signal S33 becomes lower than the low input logic threshold value VTL of the comparator constituted by the operational amplifier 304, the signal level of the signal S34 output from this operational amplifier 304 is transited to a high level. As previously explained, the signal S34 is delayed by such a delay time defined in the delay path 303 with respect to the input signal SIN, and then, the delayed signal S34 responds. It should be understood that delay components other than the delay component of the delay path 303 are neglected.

On the other hand, the above-explained related delay circuit owns such a problem that the delay time is changed in accordance with switching timing of the input signal SIN as the case may be. This problem will now be concretely explained. That is, the delay time of the output signal S34 with respect to the input signal SIN is given as such a time duration defined so that the signal S33 has started to be changed and thereafter reaches either the high input logic threshold value VTH or the low input logic threshold value VTL of the comparator which is constituted by the operational amplifier 304. In this case, assuming now that the signal S33 has previously reached the saturation condition before the input signal SIN is switched, an initial voltage when the signal S33 starts to be changed in response to the input signal SIN may be defined as either the power supply potential "VDD" or the ground potential "VSS", and also, a potential difference from this initial voltage up to the low input logic threshold voltage VTL irrespective of the switching timing of the input signal SIN. In this case, since the signal S33 is changed by a constant potential difference and based upon a predetermined time constant, the resulting delay time may become constant.

In contrast to this delay time, when the input signal SIN is switched under such a condition that the signal S33 has not yet been saturated (namely, half way of transition), such an initial voltage when the signal S33 newly starts to be changed in response to the input signal SIN is varied in response to this switching timing of the input signal SIN. As a result, a potential difference defined from the initial voltage of the signal S33 up to the input logic threshold value of the comparator does not become constant, and the time defined until the level of the signal S33 reaches the input logic threshold value may be varied in accordance with the switching timing of the input signal SIN. As a consequence, a delay time of the output signal S34 with respect to the input signal SIN does not become constant.

SUMMARY OF THE INVENTION

The present invention has been made to solve the above-described problem, and therefore, has an object to provide a delay circuit capable of making a delay time constant irrespective of switching timing of an input signal.

In order to solve the aforesaid object, the invention is characterized by having the following arrangement.

(1) A delay circuit comprising:
  a tri-state type input circuit which outputs one of a signal having a high level and a signal having a low level in response to a input signal;
  a delay path having a predetermined time constant;
  a comparing circuit which enters thereinto the signal output from the tri-state type input circuit through the delay path, and outputs a signal having a predetermined hysteresis characteristic with respect to the entered signal; and
  a control circuit which controls an output state of the input circuit to become a low impedance state in response to the input signal, and controls the output state of the input circuit to become a high impedance state in response to the output signal of the comparing circuit.

(2) The delay circuit according to (1), wherein
the comparing circuit has an upper limit and lower limit values having constant amplitudes while a predetermined reference voltage is defined as a center value, as logic threshold values with respect to the high and low levels of the signal entered via the delay path.

(3) The delay circuit according to (1), wherein
the control circuit includes an exclusive-OR gate circuit which executes exclusive-OR operation on the input signal of the input circuit and output signal of the comparing, circuit, and output a result of the exclusive-OR operation as a signal for controlling the output state of the input circuit.

(4) The delay circuit according to (1), wherein
the delay path is constituted by a resistive element and a capacitive element which are detachably mounted on the delay circuit, and
the delay circuit is manufactured as an integrated circuit on which the resistive element and the capacitive element are externally mounted.

(5) The delay circuit according to (1) further comprising a biasing circuit which biases the delay path.

(6) A delay circuit comprising:
an input circuit which outputs one of a signal having a high level and a signal having a low level in response to an input signal;
a delay path having a predetermined time constant;
a comparing circuit which enters thereinto the signal output from the input circuit, and outputs a signal having a predetermined hysteresis characteristic with respect to the delay path;
a switch circuit which is connected in parallel to the delay path; and
a control circuit which opens the switch circuit in response to the input signal and closes the switch circuit in response to the output signal of the comparing circuit.

(7) The delay circuit according to (6), wherein
the control circuit includes an exclusive-OR gate circuit which executes exclusive-OR operation on the input signal of the input circuit and output signal of the comparing circuit, and output a result of the exclusive-OR operation as a signal for controlling the switch circuit.

(8) The delay circuit according to (6), wherein
the delay path is constituted by a resistive element and a capacitive element which are detachably mounted on the delay circuit, and
the delay circuit is manufactured as an integrated circuit on which the resistive element and the capacitive element are externally mounted.

(9) A delay circuit comprising:
an input circuit which outputs one of a signal having a high level and a signal having a low level in response to a input signal;
a delay path having a predetermined time constant;
a comparing circuit which enters thereinto the signal output from the input circuit through the delay path, and outputs a signal having a predetermined hysteresis characteristic with respect to the entered signal; and
a level holding circuit which holds an output signal of the delay circuit to a predetermined level in response to the input signal of the input circuit and the output signal of the comparing circuit

(10) The delay circuit according to (9), wherein the level holding circuit starts holding the output signal of the delay circuit to the predetermined level after the output signal of the delay circuit reaches a predetermined threshold value defined by the comparing circuit, and stops holding the output signal of the delay circuit when the input signal of the input circuit changes.

(11) The delay circuit according to (10), wherein
the level holding circuit includes a tri-state type inverter and an exclusive-OR gate circuit for controlling a state of the tri-state type inverter in response to the input signal of the input circuit and the output signal of the comparing circuit.

(12) The delay circuit according to (10), wherein
the level holding circuit includes a switch circuit which is connected in parallel to the delay path, and an exclusive-OR gate circuit for controlling the switch circuit in response to the input signal of the input circuit and the output signal of the comparing circuit.

(13) The delay circuit according to (9), wherein
the delay path is constituted by a resistive element and a capacitive element which are detachably mounted on the delay circuit, and
the delay circuit is manufactured as an integrated circuit on which the resistive element and the capacitive element are externally mounted.

DETAILED DESCRIPTION OF PREFERRED EMBODIMENTS

Embodiments according to the present invention will be described with reference to the drawings.

First Embodiment

Figure 1:
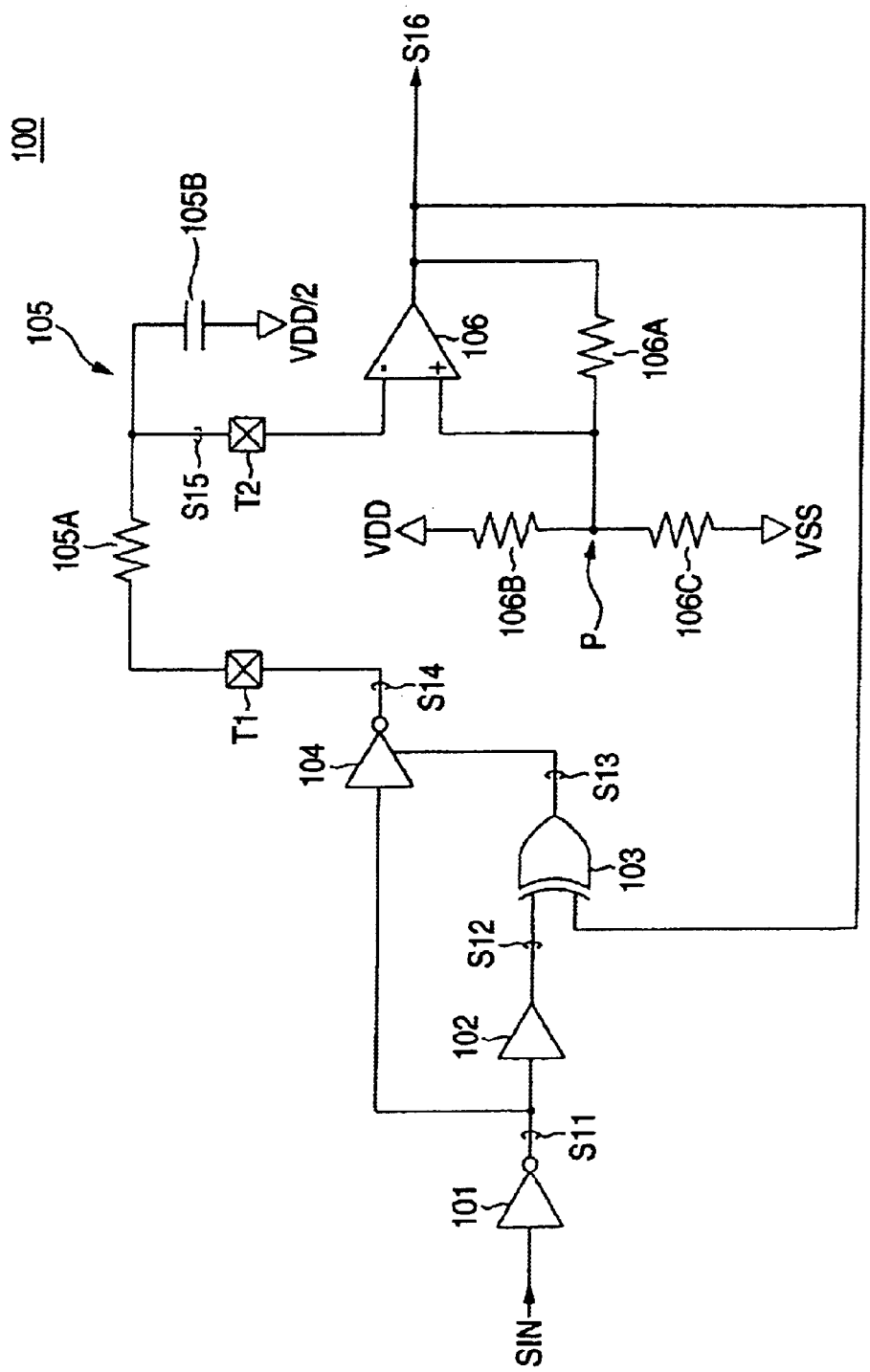
FIG. 1 is, a circuit for indicating an arrangement of a delay circuit according to an embodiment mode 1 of the present invention.

FIG. 1 shows an arrangement of a delay circuit 100 according to a first embodiment of the present invention. This delay circuit 100 is to be manufactured as an integrated circuit on a semiconductor substrate As will be explained later, both a resistive element 105A and a capacitive element 105B, which constitute a delay path 105, are detachably and externally mounted to this integrated circuit. When the circuit arrangement is explained in a concrete manner, as shown in this drawing, an input signal SIN is supplied to an input portion of an inverter 101, and an input portion of a tri-state type inverter 104 is connected to an output portion of this inverter 101. This tri-state type inverter 104 has a control terminal which is used so as to control 16 an output state of this inverter 104 to become either an high impedance state or a low impedance state, An output portion of this inverter 104 is connected to an external terminal "T1", and this inverter 104 constitutes a tri-state type input circuit in combination with the above-explained inverter 101. The input signal "SIN" corresponds to such a logic signal capable of having two values of either a high level (namely, logic value "1") or a low level (namely, logic value "0")

The resistive element 105A is connected between an external terminal "T1" and another external terminal "T2", and the capacitive element 105B is connected between the external terminal T2 and an intermediate potential "VDD/2" in such a manner that these resistive element 105A and capacitive element 105B are detachably connected in an external mounting way. Both the resistive element 105A and the capacitive element 105B constitute a delay path 105, and this delay path 105 owns a predetermined time constant which is determined based upon a resistance value of the resistive element 105A and a capacitance value of the capacitive element 105B. An inverting input terminal (−) of a positive-feedback type operational amplifier 106 is connected to an external terminal T2, and a feedback resistive element 101A is connected between anon-inverting input terminal (+) of this operational amplifier 106 and an output portion thereof. Both a resistive element 106B and another resistive element 106C are series-connected between the power supply "VDX" and the ground "VSS", and the non-inverting input terminal (+) of the operational amplifier 106 is connected to a connection (junction) point "P" between these resistive elements 106B and 106C.

In this case, the above-described operational amplifier 106 and resistive elements 106A to 106C constitute a comparing circuit (having no reference numeral) which outputs a signal S16 indicative of a hysteresis characteristic with respect to a signal S15 applied from the delay path 105 to the inverting input terminal (−) In other words, this comparing circuit represents a high input logic threshold value "VTH" for such a signal whose level is transited to a high level, whereas this comparing circuit represents a low input logic threshold value "VTL" for such a signal whose level is transited to a low level. These input logic threshold values VTH and VTL are set based upon the respective resistance values of the resistive elements 106A to 106C. For instance, assuming now that the resistance value of the resistive element 106A is 90 KΩ and each of the resistance values of the resistive elements 106B and 106C is 20 KΩ, since the resistance value of the resistive element 106B is equal to the resistance value of the resistive element 106C, a voltage appearing at the connecting point "P" may have two values in response to a level of a signal S16 output from the operational amplifier 106 via the resistive element 106A, while a half voltage of the power supply voltage VDD is defined as a center value.

Concretely speaking, if a level of the signal S16 is a low level (VSS), then a voltage appearing at the connection point "P" becomes approximately 45% of the power supply voltage VDD, and thus, this value may apply the above-described low input logic threshold value VTL. If a level of the signal S16 is a high level (VDD), then a voltage appearing at the connection point "P" becomes approximately 55% of the power supply voltage VDD, and thus, this value may apply the above-explained high input logic threshold value "VTH."

It should also be noted that both the high and low input logic threshold values VTH and VTL may apply both an upper limit value and a lower limit value of the signal S15 appearing on the delay path 105, and may directly give influences to a dependent characteristic of a delay time and also the delay time itself with respect to the switching timing of the input signal SIN. As a result, the respective resistance values of the resistive elements 106A to 106C may be designed by considering these aspects so as to properly set the high/low input logic threshold values VTH/VTL.

An input portion of a buffer 102 is connected to the output portion of the inverter 101. This buffer 102 is employed so as to adjust such timing when an output state of the inverter 104 is controlled to be brought into a low impedance state. This buffer 102 has a delay time of on the order of several nanoseconds. The output portion of the buffer 102 is connected to one input portion of an exclusive-OR gate circuit 103. These buffer 102 and exclusive-OR gate circuit 103 constitute a control circuit (having no reference numeral) used to control an output state of the tri-state type inverter 104.

Referring now to a waveform diagram (timing chart) shown in FIG. 2, operations of the delay circuit 100 according to this embodiment mode 1 will be described.

It is so assumed that under initial condition, the level of the input signal SIN is a low level; the capacitive element 105B is charged to such a voltage nearly equal to a half of the power supply voltage VDD, so that the level of the signal S15 is an intermediate level; and the level of the signal S16 output from the operational amplifier 106 to which this signal S15 is entered is a high level. As a consequence, both the signal S11 output from the inverter 101 and the signal S12 output from the buffer 102 own the high levels, and the signal S16 owns the high level. The signal S13 output from the exclusive-OR gate circuit 103 into which both the signal S16 and the signal S12 are entered owns a low level, and the output state of the tri-state type inverter 104 is brought into a high impedance state, in which this signal S13 is entered to the control terminal thereof.

When the low level of the input signal SIN is transited to a high level at a time instant "t1" from this initial condition, the high level of the signal is transited to a low level, which is output from the inverter 101 upon receipt of this input signal SIN. Thereafter, the high level of the signal S12 output from the butter 102 is transited to a low level, while this signal S12 is delayed by such a delay time (namely, several nanoseconds) of the buffer 102. As a result, the low level of the signal S13 output from the exclusive-OR gate circuit 103 is transited to a high level, while this signal S13 is delayed by such a delay time approximately equal to the delay time of the buffer 102 with respect to the signal S11, and thus, the output state of the inverter 104 in which this high-leveled signal is entered to the control terminal thereof is controlled to be brought into a low impedance state. As a result, the signal level of the signal S14 output from the inverter 104 is fixed to a high level in response to the signal S11 having the low level output from the inverter 101.

In this case, since the signal S13 is delayed by way of the buffer 102 with respect to the signal S11, there is no such a case that the output state of the inverter 104 is brought into the low impedance state before the high level of the signal S11 is transited to the low level in response to the input signal SIN. As a consequence, while the output state of the inverter 104 is controlled to be brought into the low-impedance state, a spike of the signal S14 caused by responding to the signal S11 before the level transition thereof may be prevented.

Figure 2:
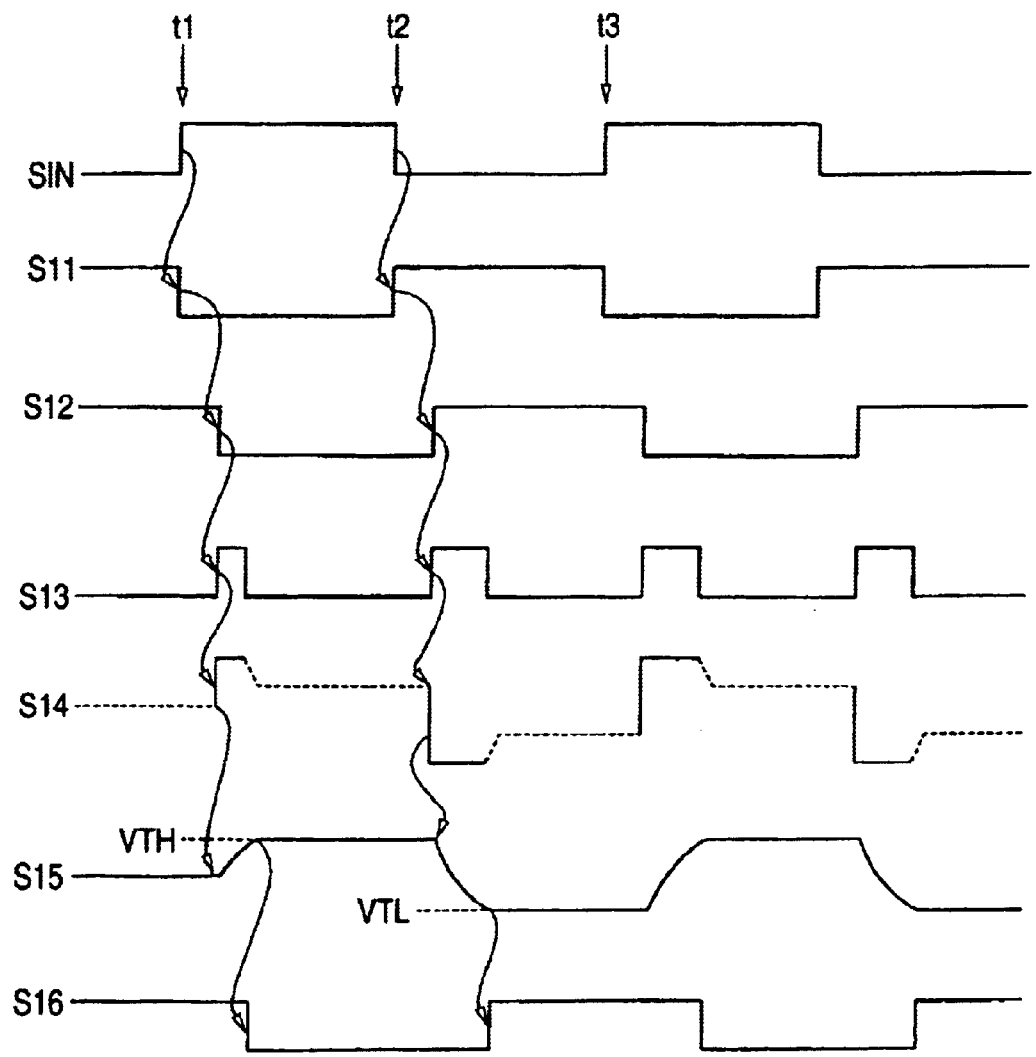
FIG. 2 is a waveform diagram for explaining operations of the delay circuit according to the embodiment mode 1 of the present invention.

It should be understood that in the waveform of the signal S14 shown in FIG. 2, a solid-line section indicates such a condition that the signal level is fixed by the inverter 104, whereas a dot-line section represents such a condition that the signal level is maintained by the capacitive element 105B.

Subsequently, when the signal level of the signal S14 is fixed to the high level, this signal S14 is propagated through the delay path 105, and the signal level of the signal S15 starts to ascend from the intermediate level in such a rate corresponding to the time constant of this delay path 105. Then, when the signal level of this signal S15 exceeds the high input logic threshold value VTH of the operational amplifier 106 with respect to the high level, the signal level of the signal S16 output from the operational amplifier 106 is transited to a low level in response to this increased level of the signal S15. This signal S16 is defined as an output signal of this delay circuit 100. The signal level of this signal S16 is transited, while this signal S16 is delayed by such a time duration defined by summing the respective delay times occurred in the inverter 101, the buffer 102, the exclusive-OR gate circuit 103, the inverter 104, the delay path 105 and the operational amplifier 106 with respect to the input signal SIN. Thus, the signal S16 owns a constant delay time with respect to the input signal SIN. For the sake of easy explanations, it is so assumed that while the respective delay times except for the delay time of the delay path 105 are neglected, the delay time produced in this delay path 105 may give the delay time of the delay circuit 100.

Subsequently, when the high level of the signal S16 is transited to a low level, the signal level of the signal S13 output from the exclusive-OR gate circuit 103 is transited to a low level in response to this signal S16. As a result, the output state of the inverter 104 is controlled to be brought into a high impedance state, and thus, the ascent of the signal S14 is stopped at levels in the vicinity of the high input logic threshold value VTH. In this case, when the output state of the inverter 104 becomes a high impedance state, the delay path 105 is brought into a floating state, and thus, both the signal level of the signal S14 and the signal level of the signal S15 are held at levels in the vicinity of the high input logic threshold value VTH by way of the capacitive element 105B.

Next, at a time instant "t2", when the input signal SIN is transited from the high level to a low level, the signal level of the signal S11 is transited to a high level in response to this signal level transition, and thereafter, the signal level of the signal S12 is transited to a high level while having a delay time of several nanoseconds. As a consequence, the signal level of the signal S13 output from the exclusive-OR gate circuit 103 is transited to a high level while being delayed by the delay time of the buffer 102 with respect to the signal S11, and thus, the output state of the inverter 104 is controlled to be brought into a low impedance state. As a result, the signal level of the signal S14 output from the inverter 104 is fixed to a low level in response to the signal S11 having the high level, which is output from the inverter 101.

When the signal level of the signal S14 becomes a low level, the signal level of the signal S15 starts to descend at such a rate corresponding to the time constant of the delay path 105 from a level in the vicinity of the high input logic threshold value VTH In other words, while the high input logic threshold value VTH is used as an initial voltage, the signal level of the signal S15 starts to be changed. Then, when the signal level of the signal S15 becomes lower than the low input logic threshold value VTL with respect to the low level, the low level of the signal S16 output from the operational amplifier 106 is transited to the high level in response to this level descent, and the signal level of the signal S13 output from the exclusive-OR gate circuit 103 is transited to a low level. As a result, the output state of the inverter 104 becomes a high impedance state, and thus, the descent of the signal 515 is stopped at a level in the vicinity of the low input logic threshold value VTL. Thereafter, the signal level of the signal S15 is held at a level in the vicinity of the low input logic threshold value VTL by the capacitive element 105B.

Next, when the signal level of the input signal SIN is transited to a high level at a time instant "t3", the signal S16 is output from the operational amplifier 106 by performing a similar operation to the above-explained operation with respect to the transition at the time instant "t1". It should be understood that in this case, the initial voltage when the signal S15 starts to ascend is nearly equal to the input logic threshold value VTL lower than the intermediate level, and the ascent of the signal S15 is stopped at a level in the vicinity of the high input logic threshold value VTH. As a consequence, a delay time of the signal S16 with respect to the input signal SIN becomes substantially equal to the delay time with respect to the above-described level transition of the input signal SIN at the time instant "t2". Thereafter, in response to the input signal SIN, the signal level of the signal S15 is transited with a constant amplitude, while the high input logic threshold value VTH is defined as an upper limit value and also the low input logic threshold value VTL is defined as a lower limit value. At this time, since both the time constant of the delay path 105 and the amplitude of the signal S15 are constant, the delay time produced in the delay path 105 becomes constant, and also, the delay time of the signal S16 with respect to the input signal SIN becomes constant. As a consequence, even when the switching timing of the input signal SIN is changed, as long as the signal S15 causes both the high input logic threshold value VTH and the low input logic threshold value VTL to be used as the upper limit value and the lower limit value, the delay time of the signal S16 with respect to the input signal SIN may become constant.

As described above, in the delay circuit 100 according to this embodiment mode 1, the time constant of the delay path 105 is made constant and also the amplitude of the signal S15 appeared on this delay path 105 is restricted to become constant, so that the delay time can be made constant. In this case, such an operation that the amplitude of the signal S15 is restricted to become constant corresponds to such an operation that the charge/discharge amounts of the capacitive element 105B which constitutes the delay path 105 are made constant. As a consequence, since the amplitude of the signal S15 when the signal level of this signal S15 is transited is made constant, then the charge/discharge times of the capacitive element 105B can become constant, and thus, the delay time can be made constant.

Further, since both the resistive element 105A and the capacitive element 105B which constitute the delay path 105 are detachably mounted on the external terminal, setting of the delay time can be arbitrarily changed.

It should be noted that although both the resistive element 105A and the capacitive element 105B are externally provided to the delay circuit 100 in the first embodiment, the present invention is not limited thereto. For instance, if the time constant of this delay path 105 need not be changed, then these resistive element 105A and capacitive element 105B may be manufactured on the same substrate as an integrated circuit in combination with other structural elements.

Second Embodiment

A description will now be made of a delay circuit according to a second embodiment according to the present invention.

In accordance with the delay circuit 100 of the first embodiment, in the case that the output state of the inverter 104 is controlled to be brought into the high impedance state, the signal level of the signal S15 is held by the capacitive element 105B. However, since both the resistive element 105A and the capacitive element 105B which constitute the delay path 105 are externally mounted on this delay circuit 100, there is a risk that the delay path 105 is brought into such an environment under which a leak path may be readily formed, and thus, the signal level of the signal S15 is not maintained in the proper manner. In such a risky case, the amplitude of the signal S15 cannot be made constant, so that the delay time may be varied. As a consequence, the second embodiment will propose such an arrangement that even when the leak path is formed at the delay path 105, the signal level of the signal S15 can be kept constant.

Figure 3:
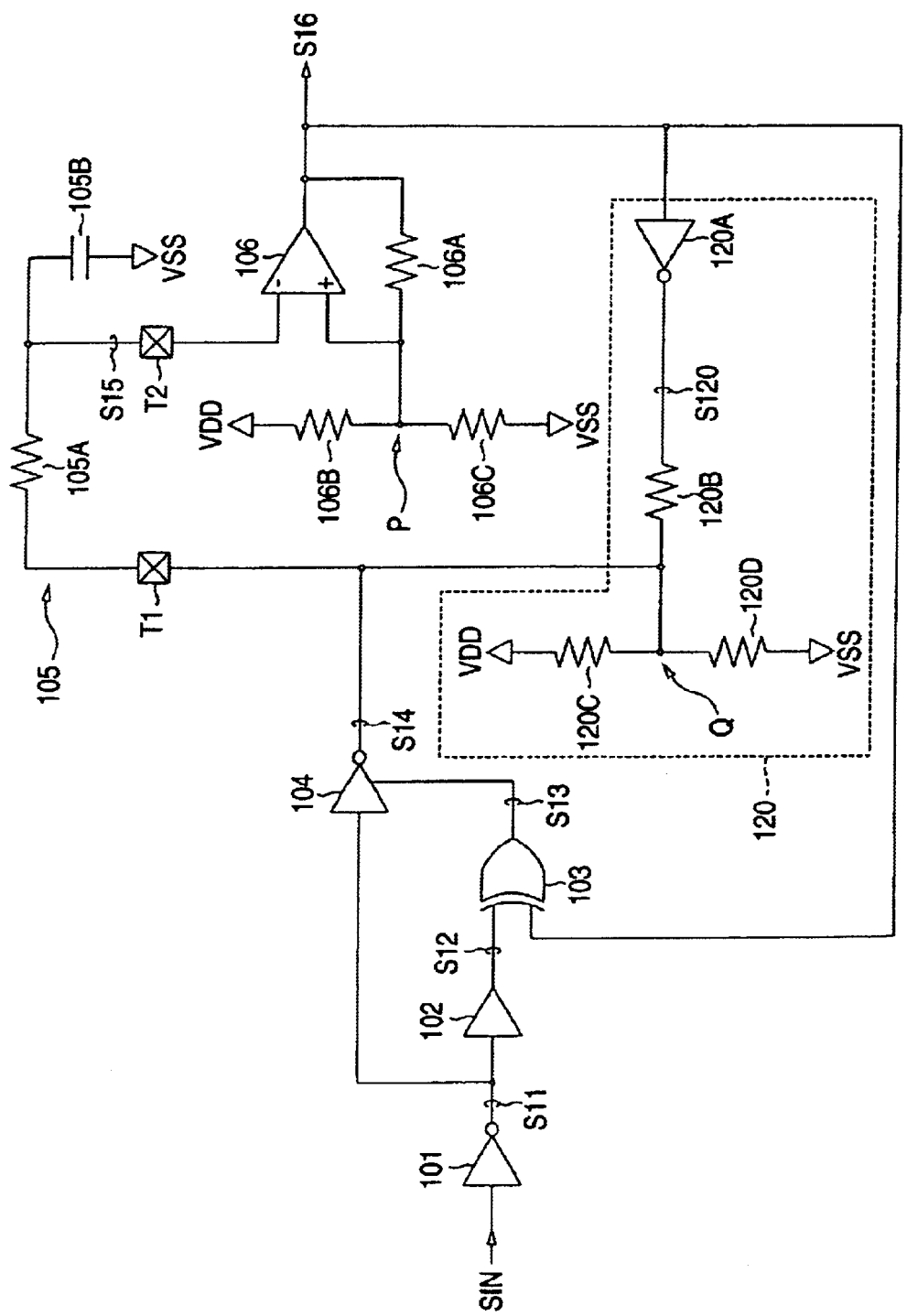
FIG. 3 is a circuit for indicating an arrangement of a delay circuit according to an embodiment mode 2 of the present invention.

FIG. 3 indicates an arrangement of a delay circuit according to the second embodiment. It should be noted that the same reference numerals shown in FIG. 1 of the first embodiment will be employed as those for denoting the same, or similar structural elements indicated in this drawing.

This delay circuit according to the second embodiment is arranged by further employing a bias circuit 120 capable of biasing the delay path 105 in the circuit arrangement of the above-explained delay circuit 100 according to the first embodiment and shown in FIG. 1. This bias circuit 120 is constituted by an inverter 120A and resistive elements 120B, 120C, 120D. Concretely speaking, an input portion of the inverter 120A is connected to the output portion of the amplifier 106, and one end of the resistive element 120B is connected to an output portion of this inverter 120A. Both the resistive element 120C and the resistive element 120D are series-connected between the power supply VDD and the ground VSS. A connection point "Q" of these resistive elements 120C and 120D is connected to the other end of the resistive element 120B, and also, is connected via the external terminal T1 to the delay path 105.

In this case, a drivability of the inverter 120A is set to be equivalent to that of the operational amplifier 106; resistance values of the resistive elements 120B, 120C, 120D are set to be equivalent to those of the resistive elements 106A, 106B, 106C, respectively; and a potential appearing on the connection point "P" is equivalent to the potential appearing on the connection point "Q". In other words, the bias circuit 120 is arranged in such a manner that this bias circuit 120 may bias the delay path 105 at such a potential equivalent to the biasing potential at the non-inverting input terminal of the operational amplifier 106. It should be understood that since a signal S16 which is applied via the resistive element 106A to the connection point P and another signal S120 which is applied via the resistive element 120B to the connection point Q have an inverting relationship each other, such a potential which appears at the connection point "Q" after the signal level of the signal S16 is transited is identical to such a potential which appeared at the connection point "P" before the signal level of the signal S16 has been transited.

Next, operations of this delay circuit according to the second embodiment will now be explained, while an attention is paid to the bias circuit 120.

It is now assumed that the signal level of the signal S15 appearing on the delay path 105 is increased toward the high input logic threshold value VTH. Under this condition, since the signal level of this signal S15 has not yet reached the high input logic threshold value VTH, the signal level of the signal S16 output from the operational amplifier 106 is a high level. Then, the signal level of the signal S120 output from the inverter 120A into which this signal S16 having the high level is entered corresponds to a low level, and this signal S120 tries to drive the delay path 105 to a low level. However, since the resistive element 120B is present between the inverter 120A and the delay path 105, the delay path 105 is driven to a high level by the signal S14 output from the inverter 104, and the signal level of the signal S15 is continuously increased.

Then, when the signal level of the signal S15 reaches the high input logic threshold value VTH of the operational amplifier 106, the signal level of the signal S16 is transited, or changed to the low level. Upon receipt of this level transition of the signal S16, as previously explained, the output state of the inverter 104 is controlled to be set to a high impedance state, and also, the level ascent of the signal S15 is stopped at such a level in the vicinity of the input logic threshold value VTH. In this case, when the signal level of the signal S15 reaches the high input logic threshold value VTH, the signal level of the signal S16 is transited to a low level, so that the potential appearing at the connection point P is transited to the low input logic threshold value VTL, on the other hand, conversely, the signal level of the signal S120 is transited to a high level. As a consequence, the potential appearing at the connection point Q becomes equal to such a potential appeared at the connection point P before the signal level of the signal 516 is transited, namely, equal to the high input logic threshold value VTH.

As a consequence, after the output state of the inverter 104 has been controlled to the high impedance state, the delay path 105 is biased by the bias circuit 120 to the high input logic threshold value VTH. As a result, even when the leak path is formed in the delay path 105, since the leaked component may be compensated by the bias circuit 120, the signal level of the signal S15 appeared on the delay path 105 may be maintained at a constant level in proximity to the high input logic threshold value VTH.

In such a case that the signal level of the signal S15 descends in response to the input signal SIN and then may reach the low input logic value VTL, the delay path 105 is biased by the bias circuit 120 to the low input logic threshold value VTL. As a consequence, the signal level of the signal S15 may be maintained to such a level in the vicinity of the low input logic threshold value VTL.

As readily understood from the descriptions, in accordance with the delay circuit of the second embodiment, even when both the resistive element 105A and the capacitive element 105B which constitute the delay path 105 are externally provided with this delay circuit, the delay time thereof can be kept constant without being adversely influenced by the leak path Third Embodiment A delay circuit according to a third embodiment of the present invention will now be explained.

In the above-described delay circuits of the first and second embodiments, the amplitude of the signal S15 appearing on the delay path 105 is restricted based upon both the high input logic threshold value VTH and the low input logic threshold value VTL of the operational amplifier 106. In the delay circuit of the third embodiment, after a signal level of such a signal appearing on a delay path has reached both the high input logic threshold value VTH and the low input logic threshold value VTL, this signal appearing on the delay path is full-swung up to either the level of the power supply VDD or the level of the ground VSS in a forcible manner. As a result, while such an amplitude is made constant which is defined from a starting point of a signal level transition of the signal appearing on the delay path up to the high, or low input logic threshold value of the operational amplifier, a delay time of the delay circuit may be made constant.

Figure 4:
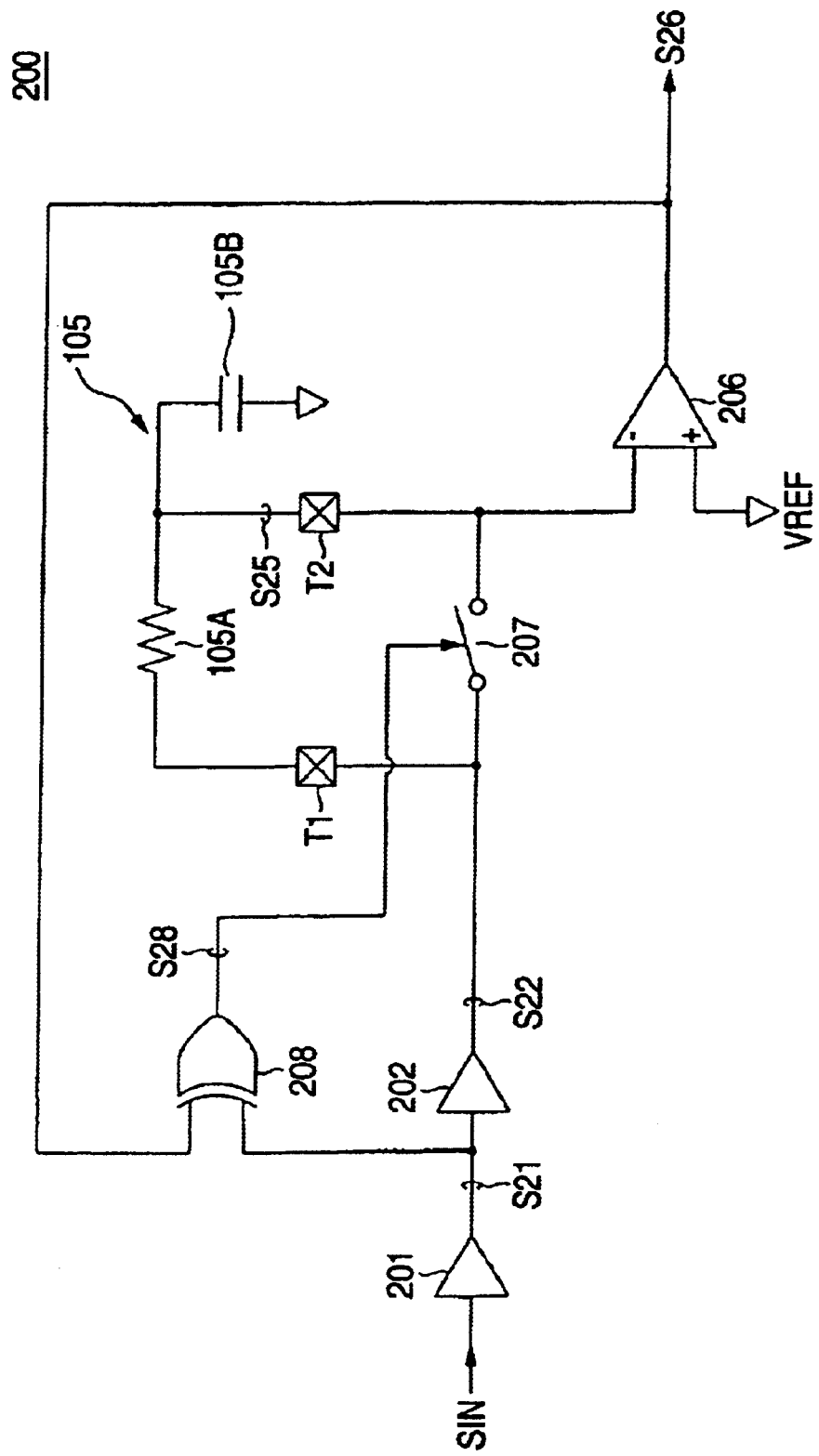
FIG. 4 is a circuit for indicating an arrangement of a delay circuit according to an embodiment mode 3 of the present invention.

FIG. 4 shows an arrangement of a delay circuit 200 according to the third embodiment. It should be noted that the same reference numerals shown in FIG. 1 of the first embodiment will be employed as those for denoting the same, or similar structural elements indicated in this drawing.

As indicated in this drawing, this delay circuit 200 is arranged by employing buffers 201 and 202, a comparator 206, a switch 207, and an exclusive-OR gate circuit 208 instead of the inverter 101, the buffer 101, the exclusive-OR gate circuit 103, the operational amplifier 106, the resistors 106A to 106C, and the tri-state type inverter 104 in the circuit arrangement indicated in FIG. 1.

The circuit arrangement of the delay circuit 200 will now be concretely explained as follows: An input signal SIN is supplied to an input portion of the buffer 201, an output portion of which is connected to the buffer 202. These buffer 201 and buffer 202 may function as an input circuit (having no reference numeral) which outputs a signal having either a high level or a low level in response to the input signal SIN. An output portion of the buffer 202 is connected to an external terminal T1. Between this external terminal T1 and another external terminal T2, a delay path 105 constructed of a resistive element 105A and a capacitive element 105B is detachably connected by an external mounting manner. A switch 207 is connected between the output portion of the buffer 202 and a non-inverting terminal of the comparator 206, while this switch 207 is connected in parallel to the delay path 105.

The inverting input terminal of the comparator 206 is connected to the external terminal T2, and a ½-voltage of the power supply voltage VDD is applied as a reference voltage "VREF" to a non-inverting input terminal of the comparator 206. A signal S26 output from this comparator 206 is used as an output signal of this delay circuit 200. One input portion of the exclusive-OR gate circuit 208 is connected to an output portion of the comparator 206, whereas an output portion of the butter 201 is connected to another input portion of the exclusive-OR gate circuit 206. The exclusive-OR gate circuit 206 functions as a control circuit for turning ON/OFF the switch 207, and a signal S28 output from the exclusive-OR gate circuit 206 is employed as a signal used to control turning-ON/OFF operations of the above-described switch 207.

Figure 5:
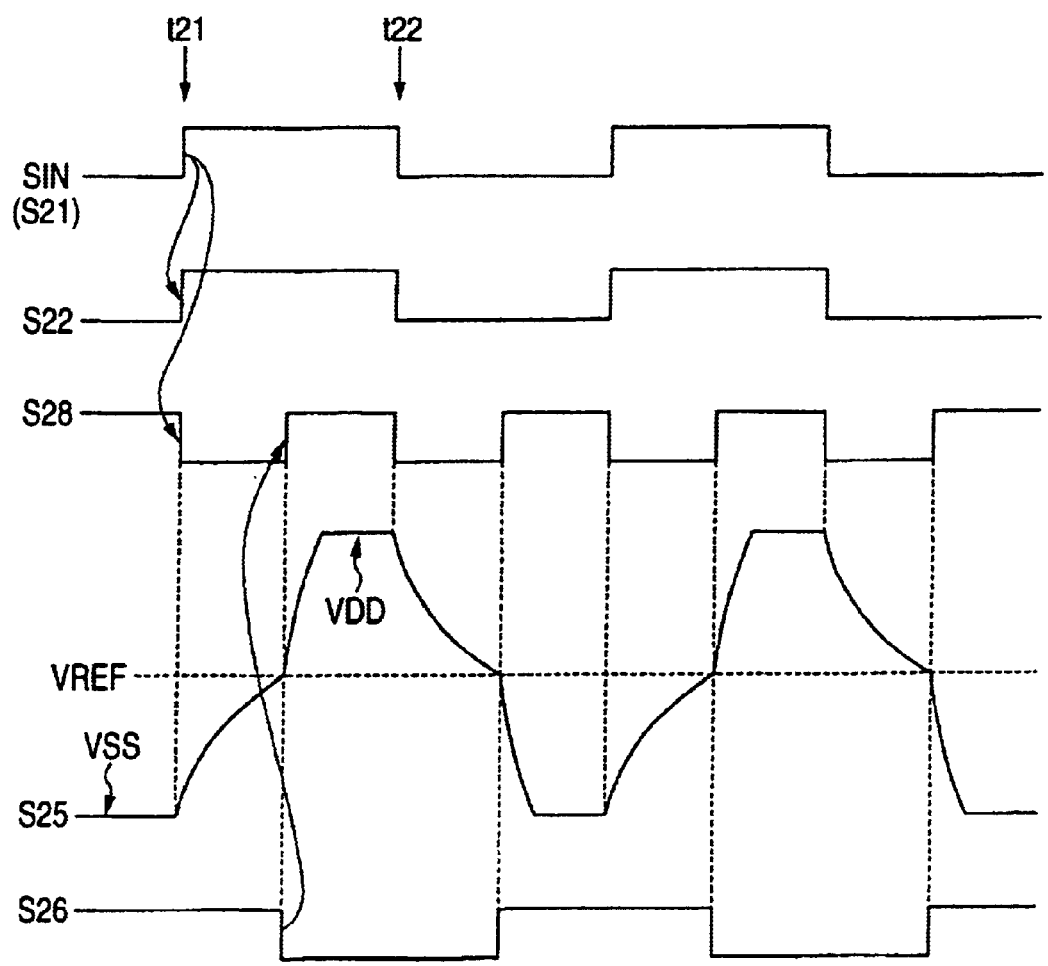
FIG. 5 is a waveform diagram for explaining operations of the delay circuit according to the embodiment mode 3 of the present invention.

Referring now to a waveform diagram shown in FIG. 5, operations of the delay circuit according to the third embodiment will be explained.

It is so assumed that the signal level of the input signal SIN is a low level under initial condition. In this case, a signal level of a signal 521 output from the buffer 201 is a low level, and a signal level of a signal S22 output from the buffer 202 is also a low level. Since the signal level of the signal S22 corresponds to the low level, a signal level of a signal S25 appearing on the delay path 105 is also a low level. Upon receipt of this low-leveled signal S25, a signal level of a signal S26 output from the comparator 206 is a high level. Furthermore, a signal level of a signal S28 output from the exclusive-OR gate circuit 208 into which both the signal S26 and the signal S21 are entered is a high level, and the operation state of the switch 207 to which this signal S28 is supplied is set under close state.

At a time instant "t21", when the signal level (low level) of the input signal SIN is transited to a high level from this initial condition, the signal level of the signal S21 output from the buffer 201 is transited to a high level upon receipt of this signal level transition. At this time, since the signal level of the signal S26 output from the comparator 206 is still kept at the high level, the signal level of the signal S28 output from the exclusive-OR gate circuit 208 is transited to a low level by receiving the signal S21 having the high level, and the switch 207 is brought into an open state. The signal level of the signal S22 output from the buffer 202 is transited to a high level by receiving the signal S21 whose signal level has been transited to a high level.

In this case, since the switch 207 is set under open state, when the signal level of the signal S22 becomes a high level, the signal level of the signal S25 appearing on the delay path 105 starts to ascend at a rate corresponding to a time constant determined based upon both the resistive element 105A and the capacitive element 105B, and when the signal level of the signal S25 reaches the reference voltage VREF, the signal level of the signal S26 output from the comparator 206 is transited to a low level. In other words, the signal level of the signal S25 reaches the reference voltage VREF after the signal level of the signal S22 has been transited to the high level and then a predetermined time has elapsed. As a consequence, the signal S26 is delayed by such a delay time defined by summing the respective delay times to each other which are produced in the buffers 201/202, the delay path 105, and the comparator 206 with respect to the input signal SIN, and then, the signal level of this delayed signal S26 is transited, so that the signal S26 may own a constant delay time with respect to the input signal SIN. It is now assumed that the delay times except for the delay time of the delay path 105 are neglected, and the delay time produced in the delay path 105 may give such a delay time of the delay circuit 200.

When the signal level of the signal S26 is transited to a low level, since the signal level of the signal S21 has already become the high level, the signal level of the signal S28 output from the exclusive-OR gate circuit 209 into which these signal S21 and signal S26 are entered is transited to a high level, and the switch 207 is controlled to be brought into the close state. As a result, both ends of the resistive element 105A of the delay path 105 are short-circuited by the switch 207, and the signal S22 output from the buffer 202 directly appears as such a signal S25 appearing on the delay path 105. As a consequence, the signal level of the signal S25 quickly reaches the power supply voltage VDD, and thus, is brought into such a condition that this signal S25 is fully-swung.

Next, when the signal level of the input signal SIN is transited to a low level at a time instant "t22", the signal level of the signal S21 is transited to a low level. At this time, since the signal level of the signal S26 output from the comparator 206, the signal level of the signal S28 output from the exclusive-OR gate circuit 208 into which these signal S21 and signal S26 are entered is transited to a low level, and the switch 207 is controlled to be brought into the open state. When the signal level of the signal S21 becomes a low level, the signal level of the signal S22 is transited to a low level upon receipt of this signal level transition of the signal S21. Since the switch 207 is set under the open state, when the signal level of the signal S22 becomes a low level, the signal level of the signal S25 appearing on the delay path 105 starts to descend from the power supply voltage VDD at a rate which is determined based upon the time constant of this delay path 105. Then, when the signal level of the signal 325 reaches the reference voltage VREF, the signal level of the signal S26 output from the comparator 206 is transited to a high level. In other words, this signal S26 is delayed by a constant time with respect to the input signal SIN, and then, the signal level of this delayed signal S26 becomes a high level.

As may be understood from the above-mentioned explanations, in the delay circuit 200 of the third embodiment, after the signal level of the signal S25 appearing on the delay path 105 reaches the reference voltage VREF and the signal level of the signal S26 is transited, the switch 207 is closed, so that the signal S25 is fully-swung. As previously explained, if the signal S25 is brought into such a full-swing condition (namely, under such a condition that signal level of signal S25 has reached either power supply voltage VDD or ground voltage VSS), even when the signal level of the input signal SIN is transited at any timing, the starting point of the change (either ascend or descend) of the signal S25 may become constant, and the amplitude of this signal S25 until the signal level of the signal S25 reaches the reference voltage VREF becomes constant. Moreover, the time constant of the delay path 105 is constant. As a consequence, the delay time of the signal S26 with respect to the input signal SIN may become constant irrespective of the switching timing of the input signal SIN.

APPLICATION EXAMPLES

Figure 6:
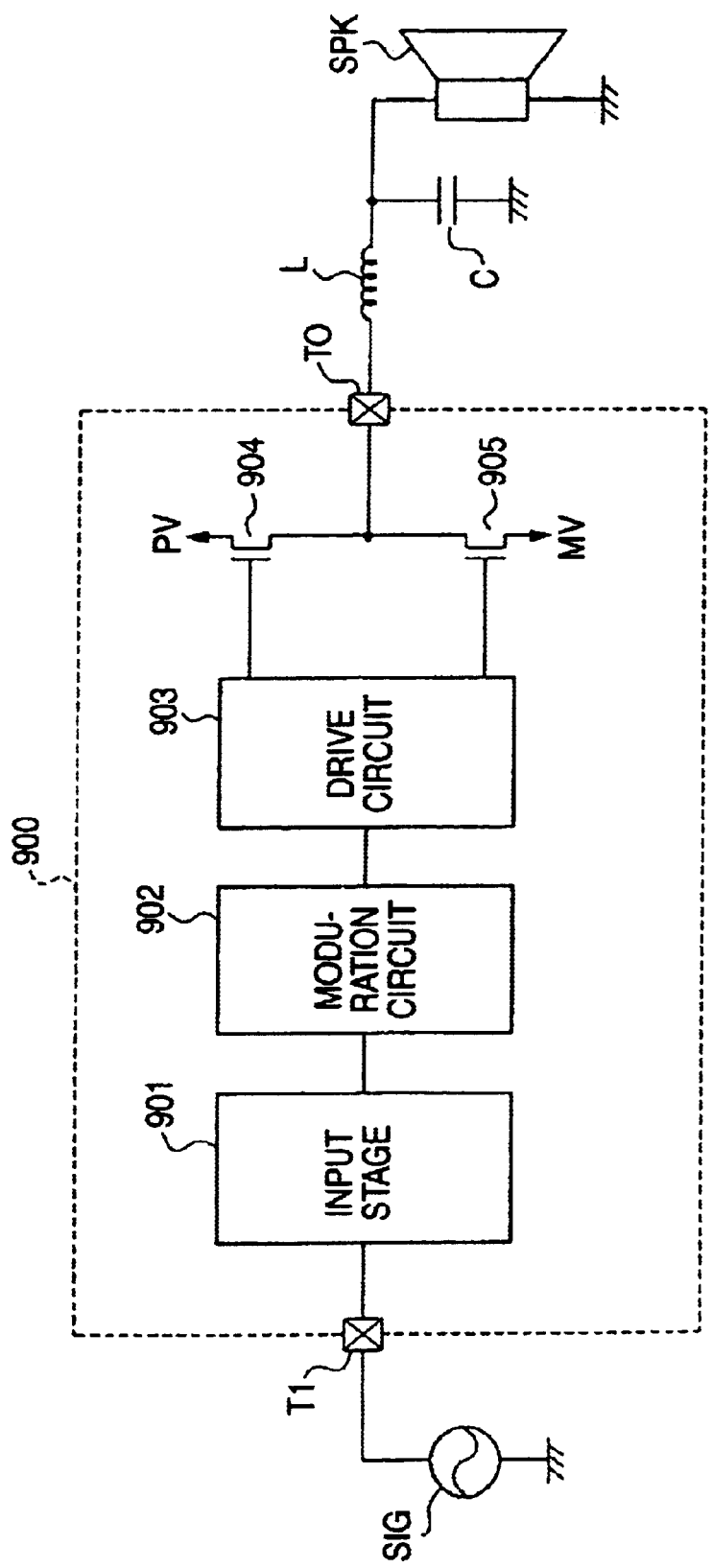
FIG. 6 is a diagram for representing an arrangement of a class-D amplifies used to explain an application example of the delay circuit according to the embodiment mode of the present invention.

Next a description will now be made of an example in which each of the above-described delay circuits of the respective embodiment modes has been applied to a class-D amplifier. FIG. 6 indicates an arrangement of a class-D amplifier 900. In this drawing, a signal source "SIG" corresponds to a music signal generating source, and this music signal has an analog amount, while the ground potential (0 V) is employed as a center point of an amplitude. This signal source SXG is connected to an input terminal "TI" of the class-D amplifier 900. The class-D amplifier 900 is a so-called "PWM (Pulse-width Modulation) amplifier" by which the music signal generated by the signal source SIG is converted into a pulse signal having a large amplitude, and then, this pulse signal having the large amplitude is power-amplified. The PWM amplifier is constituted by an input stage 901, a modulation circuit 902, a drive circuit 903, and n-type power MOS transistors 904 and 905.

In this circuit, the input stage 901 is used to convert the music signal generated from the signal source SIG into such an analog signal having a waveform which is suitable for the modulation circuit 902. The modulation circuit 902 is used to convert the analog signal output from the input stage 901 into a pulse signal, namely performs the PWM modulation on the analog input signal, while an information component of this analog signal is reflected to a pulse width. The drive circuit 903 controls to drive a pair of power MOS transistors 904 and 905 for signal output in a complementary manner based upon the pulse signal modulated by the modulation circuit 902. A current path is connected between a high voltage power supply PV (for example, +50 V) and an output terminal TO, and the power MOS transistor 904 is used to output a high level of the power-amplified pulse signal. A current path is connected between a low voltage power supply MV (for example, −50 V) and the output terminal TO, and the power MOS transistor 905 is used to output a low level of the power-amplified pulse signal. The output terminal TO is connected to an input terminal of a speaker SPK via a low-pass filter which is constructed of an inductor "L" and a capacitor "C".

In this case, the drive circuit 903 contains a high-sided driver and a low-sided driver. This high-sided driver is employed to control conductions of the power MOS transistor 904 which is connected to the high voltage power supply PV. This low-sided driver is employed to control conductions of the power MOS transistor 905 which is connected to the low voltage power supply MV. These high-sided driver and low-sided driver are equipped with internal power supplies, the respective source voltages of the power MOS transistors 904 and 905 being employed as reference voltages. As a result, these high-sided driver and low-sided driver can control conduction states of the power MOS transistors 904 and 905 which output the pulse signals having the large amplitudes in response to such a signal having the amplitude of the normal power supply.

Operations of this class-D amplifier 900 will now be explained. A music signal generated by the signal source SIG is converted into a pulse signal via the input stage 901 and the modulation circuit 902. In this case, the modulation circuit 902 reflects the amplitude of the music signal to a pulse width by way of the pulse-width modulation. The drive circuit 903 controls the conductions of the power MOS transistors 904 and 905 in the complementary manner based upon the modulated pulse signal, and thus, outputs the power-amplified pulse signal to the output terminal TO. A carrier frequency component contained in this power-amplified pulse signal is eliminated by the low-pass filter which is constituted by the inductor L and the capacitor C so as to become a power-amplified music signal having an analog amount which will be supplied to the speaker SPK.

On the other hand, in accordance with the above-described class-D amplifier 900, since the drive circuit 903 controls the conductions of the power MOS transistors 904 and 905 in the complementary manner, this drive circuit 903 outputs the power-amplified pulse signal to the output terminal TO. When one pair of these power MOS transistors 904 and 905 are brought into the conducting conditions at the same time, a large current may flow from the high-voltage power supply PV to the low-voltage power supply MV, which causes erroneous operations and malfunction. To this end, generally speaking, while such a time period (will be referred to as "dead time" hereinafter) is provided during which both the power MOS transistors 904/905 are brought into non-conducting states when the drive circuit 903 switches the conducting states of these power MOS transistors 904 and 905, after both the power MOS transistors 904 and 905 have been once controlled to be brought into the non-conducting states, any one of these power MOS transistors is made conductive in response to a pulse signal entered from the modulation circuit 902.

Figure 7:
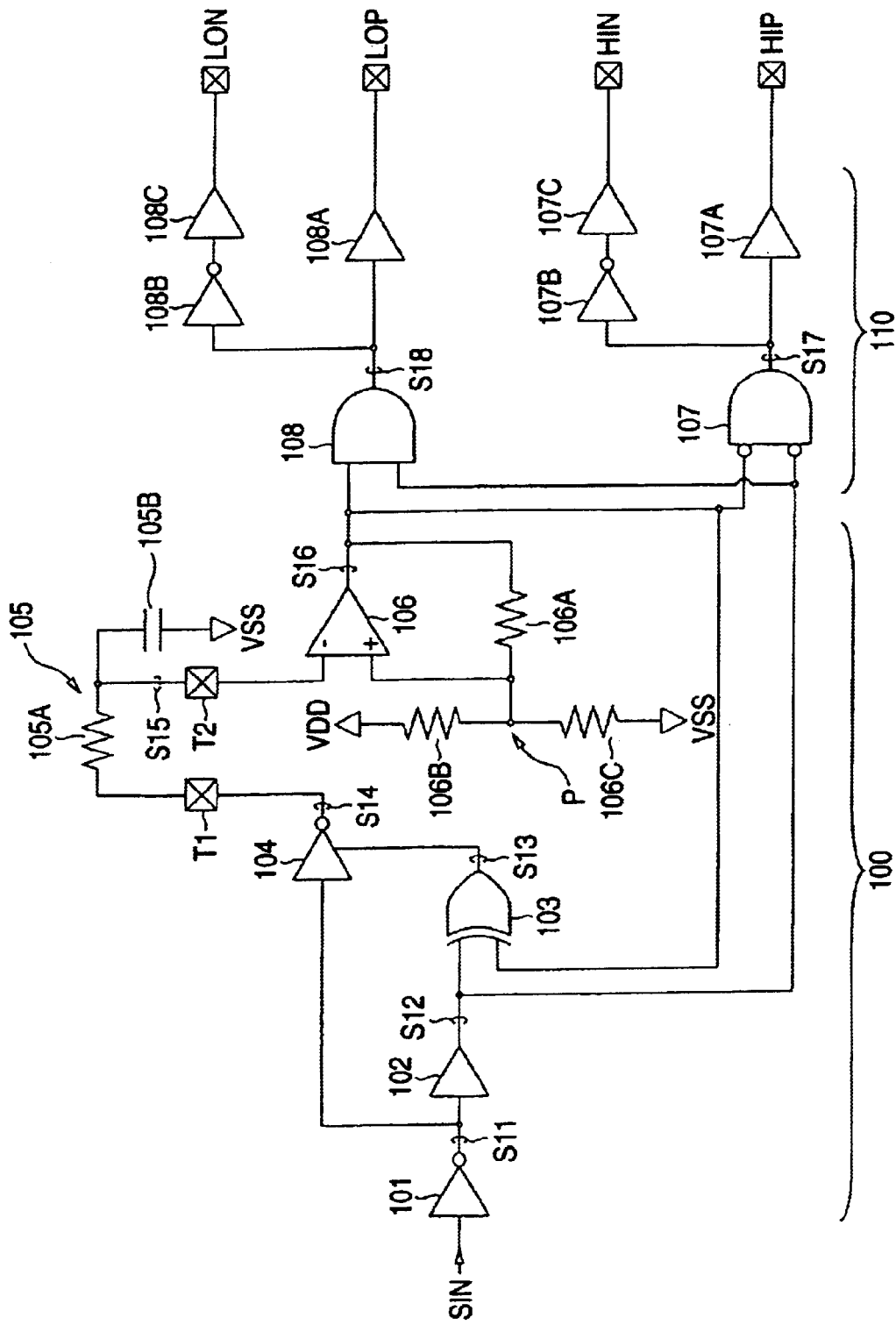
FIG. 7 is a diagram for showing a portion of the arrangement of the drive circuit to which the delay circuit according to the embodiment mode of the present invention has been applied.
Figure 8:
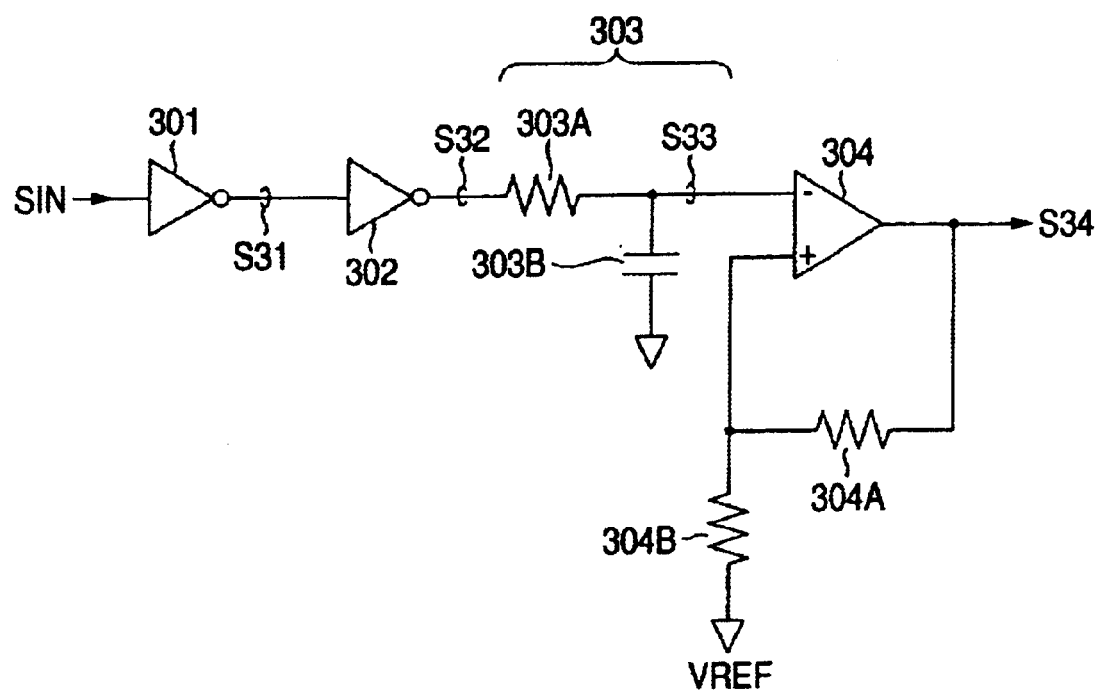
FIG. 8 is the circuit for indicating the arrangement of the delay circuit related to the prior art.
Figure 9:
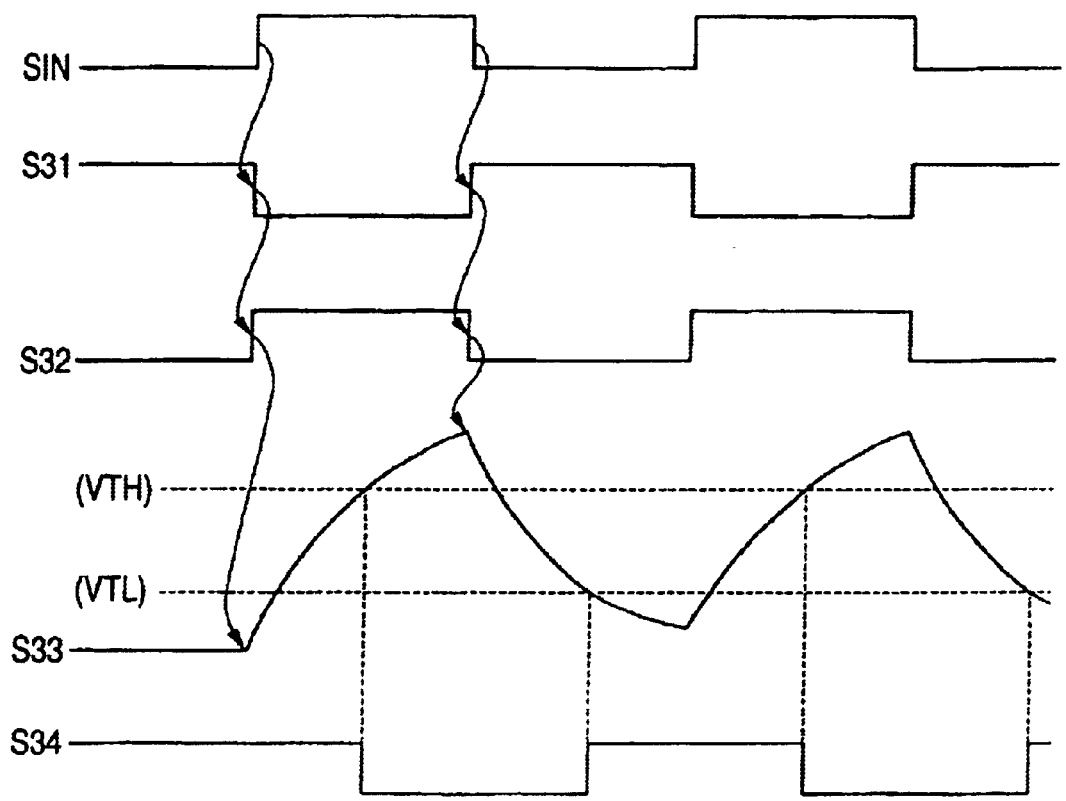
FIG. 9 is the waveform diagram for explaining the operations of the delay circuit related to the prior art.

In this case, the dead time is produced by a delay circuit built in the drive circuit 903. FIG. 7 indicates a portion of the arrangement of the drive circuit 903 to which the delay circuit 100 according to the first embodiment. As shown in this drawing, the drive circuit 903 is constituted by the delay circuit 100, a signal producing circuit 110, and high-sided driver/low-sided driver (not shown in this drawing). The pulse signal output from the modulation circuit 902 is supplied as the input signal SIN of the delay circuit 100.

In this case, the signal producing circuit 110 is employed to produce differential signals "HIN", "HIP", and differential signals "LON", "LOP" from the signal S16 output from the delay circuit 100. The deferential signals HIN and HIP drive the high-sided driver, whereas the differential signals LON and LOP drive the low-sided driver. This signal producing circuit 110 is arranged by a negative logic input type AND gate circuit (NOR gate circuit) 107, a buffer 107A, an inverter 107B, another buffer 107C, an AND gate circuit 108, a buffer 108A, an inverter 108A, and another buffer 108C.

Operations of this drive circuit 903 will now be described. When the signal level of the above-explained input signal SIN (pulse signal supplied from modulation circuit 902) is transited to a high level, the signal level of the signal S12 is transited to a low level, and the signal level of the signal S18 output from the AND gate circuit 108 is transited to a low level, into which the low-leveled signal S12 is entered. In other words, when the signal level of the input signal SIN is transited to a high level, both the signal S17 and the signal S11, whose signal levels have been the low level and the high level respectively under initial condition, commonly become low levels. At this time, the signal levels of the differential signals HIP/HIN become a low level/a high level, respectively, and then the high-sided driver into which these differential signals HIP/HIN are input may control the power MOS transistor 904 to be brought into the non-conductive state. The signal levels of the differential signals LOP/LON similarly become a low level/a high level, respectively, and then the low-sided driver into which these differential signals LOP/LON are inputted may control the power MOS transistor 905 to be brought into the non-conductive state. As a consequence, both the paired power MOS transistors 904 and 905 of the output stage are brought into the non-conductive states, so that an occurrence of a shoot-through current can be avoided.

Thereafter, when the signal level of the signal S16 is transited to a low level after a constant delay time made by the delay circuit 100 has passed, the signal level of the signal S17 output from the negative logic input type AND gate circuit 107 is transited to a high level upon receipt of this signal level transition, the signal levels of the signals S17 and S18 become a high level and a low level, respectively. As a result, the signal levels of these differential signals HIP/HIN become a high level and a low level, respectively. The high-sided driver into which these differential signals HIP/HIN are inputted may cause the power MOS transistor 904 to become conductive. As a consequence, a pulse signal having a high level may be output to the output terminal TO. Subsequently, the power MOS transistors 904 and 905 are alternately made conductive in response to the input signal SIN, while the dead time is secured between the alternate conducting operations of the power MOS transistors 904 and 905, so that a pulse signal having a large amplitude may be output. This pulse signal is filtered by the low-pass filter made of the inductor L and the capacitor C to produce an analog signal, and then, this analog signal may drive the speaker SPK.

It should be noted that although the delay circuit 100 according to the first embodiment has been employed in the above-described application example, the delay circuits according to the second and third embodiments may be alternatively employed.

As described above, in accordance with the present invention, since the delay circuit is arranged in such a manner that the amplitude of the signal appeared on the delay path is restricted to become constant, there is no case that the starting point of the change of the signal appearing on the delay path is varied depending upon the switching timing of the input signal. As a consequence, the delay time can be made constant irrespective of the switching timing of the input signal.

In accordance with the present invention, since the delay circuit is arranged in such a manner that the amplitude of the signal appeared on the delay path is full-swung, similarly, there is no case that the starting point of the change of the signal appearing on the delay path is varied depending upon the switching timing of the input signal. As a consequence, the delay time can be made constant irrespective of the switching timing of the input signal.

What is claimed is:

1. A delay circuit comprising:
    a tri-state type input circuit which outputs one of a signal having a high level and a signal having a low level in response to a input signal;
    a delay path having a predetermined time constant;
    a comparing circuit which enters thereinto the signal output from the tri-state type input circuit through the delay path, and outputs a signal having a predetermined hysteresis characteristic with respect to the entered signal; and
    a control circuit which controls an output state of the input circuit to become a low impedance state in response to the input signal, and controls the output state of the input circuit to become a high impedance state in response to the output signal of the comparing circuit.

2. The delay circuit according to claim 1, wherein
    the comparing circuit has an upper limit and lower limit values having constant amplitudes while a predetermined reference voltage is defined as a center value, as logic threshold values with respect to the high and low levels of the signal entered via the delay path.

3. The delay circuit according to claim 1, wherein
    the control circuit includes an exclusive-OR gate circuit which executes exclusive-OR operation on the input signal of the input circuit and output signal of the comparing circuit, and output a result of the exclusive-OR operation as a signal for controlling the output state of the input circuit.

4. The delay circuit according to claim 1, wherein
    the delay path is constituted by a resistive element and a capacitive element which are detachably mounted on the delay circuit, and
    the delay circuit is manufactured as an integrated circuit on which the resistive element and the capacitive element are externally mounted.

5. The delay circuit according to claim 1 further comprising a biasing circuit which biases the delay path.

6. A delay circuit comprising:
    an input circuit which outputs one of a signal having a high level and a signal having a low level in response to an input signal;
    a delay path having a predetermined time constant;
    a comparing circuit which enters thereinto the signal output from the input circuit, and outputs a signal having a predetermined hysteresis characteristic with respect to the delay path;
    a switch circuit which is connected in parallel to the delay path; and
    a control circuit which opens the switch circuit in response to the input signal and closes the switch circuit in response to the output signal of the comparing circuit.

7. The delay circuit according to claim 6, wherein
    the control circuit includes an exclusive-OR gate circuit which executes exclusive-OR operation on the input signal of the input circuit and output signal of the comparing circuit, and output a result of the exclusive-OR operation as a signal for controlling the switch circuit.

8. The delay circuit according to claim 6, wherein
    the delay path is constituted by a resistive element and a capacitive element which are detachably mounted on the delay circuit, and the delay circuit is manufactured as an integrated circuit on which the resistive element and the capacitive element are externally mounted.

9. A delay circuit comprising:

an input circuit which outputs one of a signal having a high level and a signal having a low level in response to a input signal;

a delay path having a predetermined time constant;

a comparing circuit which enters thereinto the signal output from the input circuit through the delay path, and outputs a signal having a predetermined hysteresis characteristic with respect to the entered signal; and a level holding circuit which holds an output signal of the delay circuit to a predetermined level in response to the input signal of the input circuit and the output signal of the comparing circuit.

10. The delay circuit according to claim 9; wherein the level holding circuit starts holding the output signal of the delay circuit to the predetermined level after the output signal of the delay circuit reaches a predetermined threshold value defined by the comparing circuit, and stops holding the output signal of the delay circuit when the input signal of the input circuit changes.

11. The delay circuit according to claim 10, wherein the level holding circuit includes a tri-state type inverter and an exclusive-OR gate circuit for controlling a state of the tri-state type inverter in response to the input signal of the input circuit and the output signal of the comparing circuit.

12. The delay circuit according to claim 10, wherein the level holding circuit includes a switch circuit which is connected in parallel to the delay path, and an exclusive-OR gate circuit for controlling the switch circuit in response to the input signal of the input circuit and the output signal of the comparing circuit.

13. The delay circuit according to claim 9, wherein the delay path is constituted by a resistive element and a capacitive element which are detachably mounted on the delay circuit, and the delay circuit is manufactured as an integrated circuit on which the resistive element and the capacitive element are externally mounted.

* * * * *